(12) United States Patent
Ivira et al.

(10) Patent No.: US 10,284,168 B2
(45) Date of Patent: May 7, 2019

(54) BULK ACOUSTIC WAVE RESONATOR

(71) Applicant: Avago Technologies General IP (Singapore) Pte. Ltd., Singapore (SG)

(72) Inventors: Brice Ivira, San Jose, CA (US); John D. Larson, III, Palo Alto, CA (US); Robert Thalhammer, Munich (DE); Klaus-Guenter Oppermann, Holzkirchen (DE)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/336,277

(22) Filed: Oct. 27, 2016

(65) Prior Publication Data

US 2018/0123558 A1    May 3, 2018

(51) Int. Cl.
| | | |
|---|---|---|
| H03H 9/02 | (2006.01) | |
| H03H 9/17 | (2006.01) | |
| H03H 9/58 | (2006.01) | |
| H03H 9/13 | (2006.01) | |
| H03H 9/60 | (2006.01) | |

(52) U.S. Cl.
CPC .... *H03H 9/02086* (2013.01); *H03H 9/02118* (2013.01); *H03H 9/132* (2013.01); *H03H 9/173* (2013.01); *H03H 9/175* (2013.01); *H03H 9/587* (2013.01); *H03H 9/589* (2013.01); *H03H 9/605* (2013.01)

(58) Field of Classification Search
CPC .. H03H 9/15; H03H 9/17–9/175; H03H 9/54; H03H 9/56

USPC .................................................. 333/186–192
See application file for complete search history.

(56) References Cited

U.S. PATENT DOCUMENTS

| | | | |
|---|---|---|---|
| 5,587,620 A | 12/1996 | Ruby | |
| 5,873,153 A | 2/1999 | Ruby | |
| 5,910,756 A | 6/1999 | Ella | |
| 6,107,721 A | 8/2000 | Lakin | |
| 6,215,375 B1* | 4/2001 | Larson, III | H03H 9/132 310/321 |
| 6,262,637 B1 | 7/2001 | Bradley | |
| 6,507,983 B1 | 1/2003 | Ruby et al. | |
| 6,714,102 B2* | 3/2004 | Ruby | H03H 3/02 181/293 |
| 6,828,713 B2 | 12/2004 | Bradley | |
| 7,212,082 B2* | 5/2007 | Nagao | H01L 41/316 310/324 |
| 7,280,007 B2 | 10/2007 | Feng | |
| 7,345,410 B2 | 3/2008 | Grannen et al. | |
| 7,358,831 B2 | 4/2008 | Larson | |
| 7,369,013 B2 | 5/2008 | Fazzio | |
| 7,388,454 B2 | 6/2008 | Ruby et al. | |
| 7,561,009 B2 | 7/2009 | Larson et al. | |
| 7,629,865 B2 | 12/2009 | Ruby et al. | |

(Continued)

*Primary Examiner* — Dean O Takaoka
*Assistant Examiner* — Alan Wong (57) ABSTRACT

A bulk acoustic wave (BAW) resonator includes: an acoustic reflector disposed in a substrate; a lower electrode disposed over the acoustic reflector; a piezoelectric layer disposed over the lower electrode; and an upper electrode disposed over the piezoelectric layer. A contacting overlap of the lower electrode, the piezoelectric layer and the upper electrode over the acoustic reflector comprising an active area of the BAW resonator. An opening exists in the upper electrode in a region of the BAW resonator susceptible to unacceptable overheating.

24 Claims, 5 Drawing Sheets

(56) References Cited

U.S. PATENT DOCUMENTS

| | | |
|---|---|---|
| 7,714,684 B2 | 5/2010 | Ruby et al. |
| 7,791,434 B2 | 9/2010 | Fazzio |
| 7,889,027 B2 * | 2/2011 | Oka .................. H03H 9/02102 310/365 |
| 8,188,810 B2 | 5/2012 | Feng |
| 8,230,562 B2 | 7/2012 | Fazzio |
| 8,248,185 B2 | 8/2012 | Choy |
| 8,436,516 B2 | 5/2013 | Ruby et al. |
| 8,902,023 B2 | 12/2014 | Choy |
| 9,197,185 B2 | 11/2015 | Zou |
| 9,243,316 B2 | 1/2016 | Larson |
| 9,853,626 B2 * | 12/2017 | Burak .................... H03H 9/132 |
| 2007/0205850 A1 | 9/2007 | Jamneala |
| 2011/0180391 A1 | 7/2011 | Larson et al. |
| 2011/0266925 A1 | 11/2011 | Ruby |
| 2012/0177816 A1 | 7/2012 | Larson |
| 2012/0326807 A1 | 12/2012 | Choy et al. |
| 2013/0015747 A1 | 1/2013 | Ruby |
| 2013/0049545 A1 | 2/2013 | Zou |
| 2013/0147577 A1 * | 6/2013 | Nishihara .............. H03H 9/706 333/133 |
| 2014/0118090 A1 | 5/2014 | Grannen |
| 2014/0132117 A1 | 5/2014 | Larson |
| 2014/0175950 A1 | 6/2014 | Zou |
| 2014/0225682 A1 | 8/2014 | Burak |
| 2014/0292150 A1 | 10/2014 | Zou |
| 2014/0354109 A1 | 12/2014 | Grannen |
| 2015/0207489 A1 | 7/2015 | Bi |
| 2015/0244347 A1 | 8/2015 | Feng |
| 2015/0280687 A1 * | 10/2015 | Burak .................... H03H 9/132 310/321 |
| 2015/0311046 A1 | 10/2015 | Yeh |

* cited by examiner

BULK ACOUSTIC WAVE RESONATOR

BACKGROUND

Electrical resonators are widely incorporated in modern electronic devices. For example, in wireless communications devices, radio frequency (RF) and microwave frequency resonators are used in filters, such as filters having electrically connected series and shunt resonators forming ladder and lattice structures. The filters may be included in a duplexer (diplexer, triplexer, quadplexer, quintplexer, notch filters, etc.) for example, connected between an antenna and a transceiver for filtering received and transmitted signals.

Various types of filters use mechanical resonators, such as bulk acoustic wave (BAW) resonators, including film bulk acoustic resonators (FBARs) and solidly mounted resonators (SMRs), or surface acoustic wave (SAW) resonators. The resonators convert electrical signals to mechanical signals or vibrations, and/or mechanical signals or vibrations to electrical signals. A BAW resonator, for example, is an acoustic device comprising a stack that generally includes a layer of piezoelectric material between two electrodes. Acoustic waves achieve resonance across the acoustic stack, with the resonant frequency of the waves being determined by the materials in the acoustic stack and the thickness of each layer (e.g., piezoelectric layer and electrode layers). One type of BAW resonator includes a piezoelectric film as the piezoelectric material, which may be referred to as an FBAR as noted above. FBARs resonate at GHz frequencies, and are thus relatively compact, having thicknesses on the order of microns and length and width dimensions of hundreds of microns.

Among other uses, acoustic resonators may be used as notch filters or band-pass filters with associated passbands providing ranges of frequencies permitted to pass through the filters. With increasing power requirements placed on devices (e.g., mobile phones), ever increasing power demands are placed on filters, and particularly the resonators of the filters. These increasing power demands can have adverse impacts on the performance and reliability of the resonators. For example, as radio frequency (RF) signals with greater electrical power are applied to known RF resonators, excessive self-heating can occur near the geometric center of the active acoustic stack, which is the farthest from the points where the active acoustic stack contacts the substrate (so-called anchor points where power is dissipated). As can be appreciated, the size of the hot spot depends on the frequency and power applied and absorbed.

The temperature gradient in the hot spot creates an active area divided into multiple resonators resonating at different frequencies, and with different acoustic properties. This temperature gradient also impacts the physical properties of the material (e.g., material stiffness), and creates acoustic discontinuities in the active acoustic stack. These acoustic discontinuities in the region of the hot spot results in further energy confinement, which is manifest in further heating at the hot spot. Ultimately, the confinement of acoustic waves and attendant concentration of thermal energy at the hot spot can cause at least bowing of the active acoustic stack in FBARs, adversely impacting the acoustic response of the resonator; and at most rupturing of the active acoustic stack and catastrophic loss of the acoustic resonator.

What is needed, therefore, is a BAW resonator that overcomes at least the shortcomings of known BAW resonators described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

According to representative embodiments described below, a bulk acoustic wave (BAW) resonator comprises: an acoustic reflector disposed in a substrate; a lower electrode disposed over the acoustic reflector; a piezoelectric layer disposed over the lower electrode; and an upper electrode disposed over the piezoelectric layer. A contacting overlap of the lower electrode, the piezoelectric layer and the upper electrode over the acoustic reflector comprising an active area of the BAW resonator. An opening exists in the upper electrode in a region of the BAW resonator susceptible to unacceptable overheating.

When connected in a selected topology, a plurality of the resonators can act as an electrical filter. For example, the acoustic resonators may be arranged in a ladder-filter or lattice-filter arrangement, such as described in U.S. Pat. No. 5,910,756 to Ella, and U.S. Pat. No. 6,262,637 to Bradley, et al., the disclosures of which are specifically incorporated herein by reference. The electrical filters may be used in a number of applications, such as in duplexers (diplexers, triplexers, quadplexers, quintplexers, etc.).

A variety of devices, structures thereof, materials and methods of fabrication are contemplated for the BAW resonators of the apparatuses of the present teachings. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,714,684, and 8,436,516 to Ruby et al.; U.S. Pat. Nos. 7,369,013, 7,791,434, and 8,230,562 to Fazzio, et al.; U.S. Pat. Nos. 8,188,810, and 7,280,007 to Feng et al.; U.S. Pat. Nos. 8,248,185, and 8,902,023 to Choy, et al.; U.S. Pat. No. 7,345,410 to Grannen, et al.; U.S. Pat. No. 6,828,713 to Bradley, et al.; U.S. Pat. Nos. 7,561,009, 7,358,831, 9,243, 316 to Larson, III et al.; U.S. Pat. No. 9,197,185 to Zou, et al., U.S. Patent Application Publication No. 20120326807 to Choy, et al.; U.S. Pat. No. 7,629,865 to Ruby; U.S. Patent Application Publications Nos. 20110180391, and 20120177816 to Larson III, et al.; U.S. Patent Application No. 20140132117 to Larson III; U.S. Patent Application Publication No. 20070205850 to Jamneala et al.; U.S. Patent Application Publication No. 20110266925 to Ruby, et al.: U.S. Patent Application Publication No, 20130015747 to Ruby, et al.; U.S. Patent Application Publication No. 20130049545 to Zou, et al.; U.S. Patent Application Publication No. 20140225682 to Burak, et al.; U.S. Patent Publication Nos.: 20140118090 and 20140354109 to Grannen, et al.; U.S. Patent Application Publication Nos. 20140292150, and 20140175950 to Zou, et al.; U.S. Patent Application Publication No. 20150244347 to Feng, et al.; U.S. Patent Application Publication 20150311046 to Yeh, et al.; and U.S. Patent Application Publication 20150207489 to Bi, et al. The entire disclosure of each of the patents, and patent application publications listed above are hereby specifically incorporated by reference herein. It is emphasized that the components, materials and methods of fabrication described in these patents and patent applications are representative, and other methods of fabrication and materials within the purview of one of ordinary skill in the art are also contemplated.

Figure 1A:
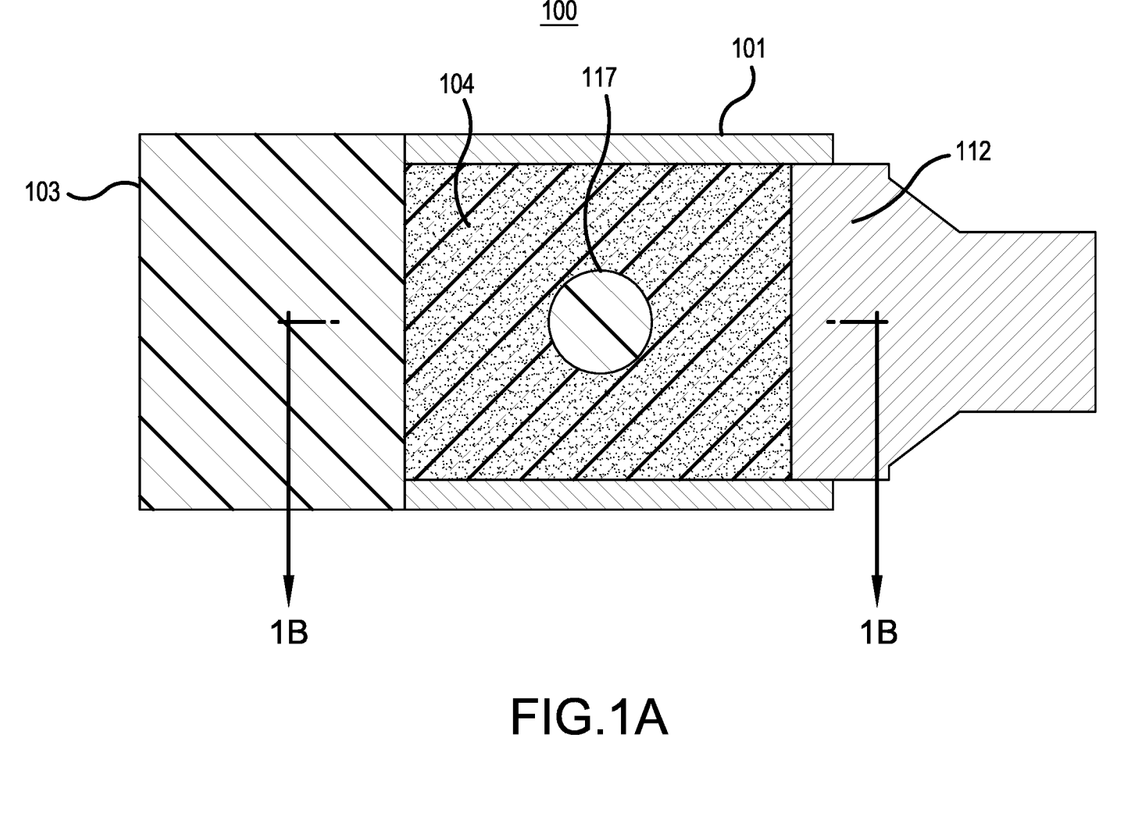
FIG. 1A is a top view of a bulk acoustic wave (BAW) resonator in accordance with a representative embodiment.

FIG. 1A is a top view of a bulk acoustic wave (BAW) resonator 100 in accordance with a representative embodiment.

The BAW resonator 100 comprises a lower electrode (not shown in FIG. 1A) disposed over a substrate 101, and an upper electrode 104 disposed over a piezoelectric layer 103. A passivation layer (not shown in FIG. 1A) may be provided over the upper electrode, as may other components (not shown) such as mass loading layers that are useful in improving the performance of the BAW resonator 100.

The BAW resonator 100 comprises an interconnect side 112 for providing a signal input or signal output to the upper electrode 104. A bridge (not shown in FIG. 1A) may be provided between the upper electrode 104 and the interconnect 112; and cantilevered portions (not shown in FIG. 1A) may be provided over one or more of the sides of the upper electrode 104, excepting the side of the interconnect 112.

Figure 1B:
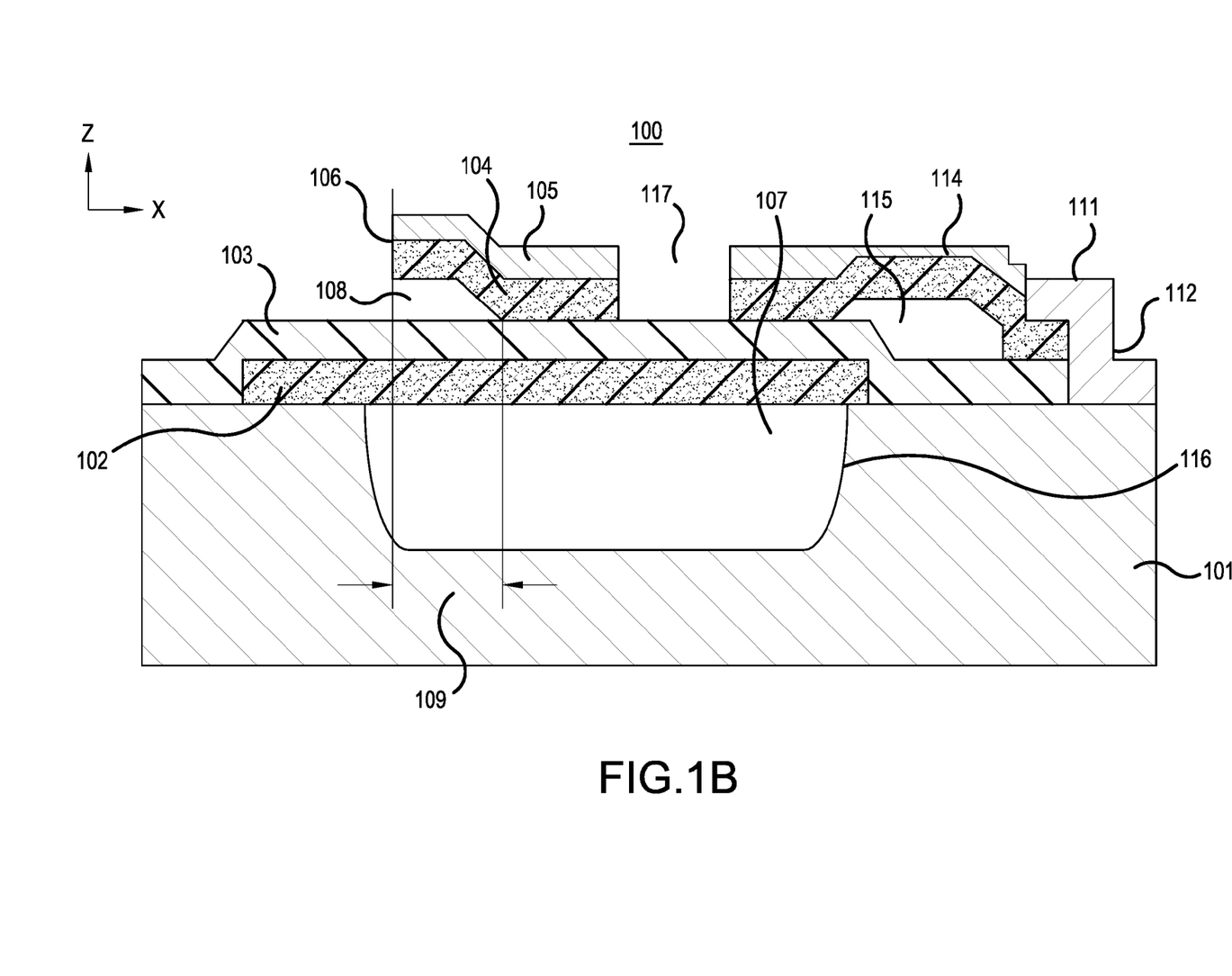
FIG. 1B is a cross-sectional view of a BAW resonator in accordance with a representative embodiment.
Figure 1C:
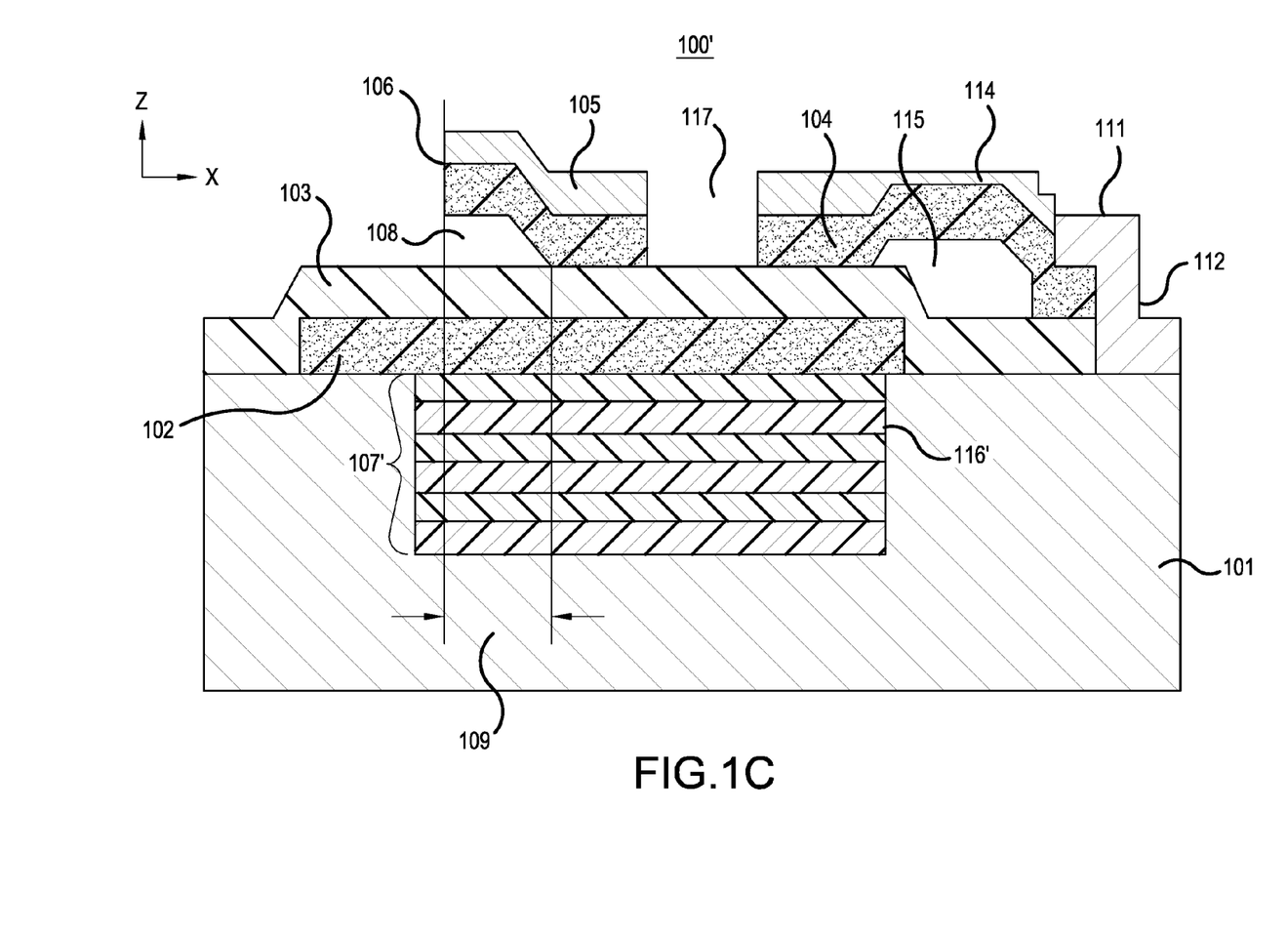
FIG. 1C is a cross-sectional view of a BAW resonator in accordance with a representative embodiment.

As depicted more clearly in FIGS. 1B and 1C, the region of contacting overlap of the lower electrode (not shown in FIG. 1A), upper electrode 104, the piezoelectric layer 103 and the cavity (not shown in FIG. 1A), or other acoustic reflector (e.g., Bragg reflector (see FIG. 1C)) is referred to as an active area of the BAW resonator 100. The acoustic motion of particles is launched and propagated in this area. This acoustic motion contributes to the self-heating of the BAW resonator 100 described below. By contrast, an inactive area of the BAW resonator 100 comprises a region of overlap between lower electrode (not shown in FIG. 1A), or upper electrode 104, or both, and the piezoelectric layer 103 is not disposed over the cavity, or other acoustic reflector— (e.g., Bragg reflector).

An opening 117 is provided in the upper electrode 104. As described more fully below, the opening 117 is not made in layers beneath the upper electrode (e.g., the piezoelectric layer 103, or the lower electrode (not shown in FIG. 1A). As will become clearer as the present description continues, the opening 117 is generally located substantially at the geometric center or central portion of the active area of the BAW resonator 100, and has an areal dimension that approximates the area of the region of a BAW resonator, which does not include the opening, where self-heating is the greatest. More generally, and as will become clearer as the present description continues, a center of the opening 117 is located at substantially the greatest distance from an anchor point of BAW resonator 100.

As described below in connection with various representative embodiments, the opening 117 is located in a region of the BAW resonator 100 that is susceptible to unacceptable levels of overheating caused by self-heating of the BAW resonator 100. Generally, this region is comparatively far from a thermal ground, or anchor point, which is a portion of the inactive area that contacts the substrate 101. Notably, the shape of the opening 117 is chosen to somewhat match the shape of the region where self-heating can be unacceptably high in known BAW resonators (i.e., BAW resonators without the opening). Illustratively, the opening 117 has a substantially circular shape, as shown. However, this is not essential, and other shapes are contemplated.

Because the thermal resistance is greater from the geometric center of a BAW resonator to the edge (anchor point) of the BAW resonator than it is from points on the BAW resonator closer to the edge (anchor point) of the BAW resonator, the propensity for unacceptable levels of self-heating is comparatively great in known BAW resonators. By thermal conduction (interaction between phonons-electrons) the heat wave is partially evacuated from the active area of the known BAW resonator farther away into the substrate, which helps to cool down the active area. As air is a comparatively poor thermal conductor, there is no significant heat conduction through the air, and, as such, no heat flow out of the top of or beneath the membrane of the known BAW resonator. However, the heat can be evacuated from the active area only by flowing through the anchor points. Thus, a thermal gradient is generated in the x-y plane. As noted, in the known BAW resonator, the center or central portion of the active area (membrane when over a cavity), which is located farther from the anchor point with substrate, is hotter than the perimeter of the active area. As such, the distance the heat has to travel from the center of the BAW resonator to the edge is comparatively large, and then thermal resistance degrades. In addition, there is potentially more non-uniform stress/strain in the membrane as it gets larger. Ultimately, the BAW resonator can operate at unacceptably high temperatures, which can reduce its electrical performance (mainly manifest in a reduced quality factor (Q) and electromechanical coupling ($kt^2$)); reduce its power handling; degrade its insertion loss; and shift the passband of a filter comprising known BAW resonators.

By contrast, by removing a portion of the upper electrode 104 of the BAW resonator 100 to provide the opening 117, the BAW resonator 100 does not have an active area at the opening 117. Stated somewhat differently, the region of the active area in known BAW resonators, which is susceptible to higher levels of heating, is removed in the BAW resonators of the present teachings. Accordingly, substantially no electric field is supported in the region of the BAW resonator 100 at the opening, and energy cannot be absorbed in the region of the opening 117. Beneficially, therefore, eliminating the ability for the piezoelectric effect to be supported in the opening 117 eliminates the propagation of acoustic waves in the region of the opening 117, and thus eliminates the incidence of self-heating in this region of the BAW resonator 100. As noted above, according to a representative embodiment, the center of the opening 117 is located at substantially the greatest distance from an anchor point of BAW resonator 100 to provide beneficial elimination of the region of the active area of the BAW resonator that is susceptible, if not most susceptible, to unacceptable overheating.

In order to maintain the impedance of the BAW resonator 100 with the region of the opening 117 not contributing to the active area of the device, the dimensions of the BAW resonator 100 are increased outside of the region of the opening 117 by an amount substantially equal to the area of the opening 117. Because the distance from any point on the active area of the BAW resonator 100 to the anchor point is necessarily less by the elimination of the portion of the upper electrode 104 to form the opening 117, the overall thermal resistance of the BAW resonator 100 is lower, and energy is dissipated from points on the active area closer to the anchor point. While points in the active area of the BAW resonator 100 that are farther from the edges (anchor points) experience greater self heating than those points closer to the edges, because the portion of the BAW resonator 100 that is most susceptible to extreme self-heating has been removed, the magnitude of the thermal resistance and thereby thermal heating of the BAW resonator 100 is reduced. Accordingly, the overall thermal profile of the BAW resonator 100 is beneficially reduced. This reduction in self-heating enables application of RF signals to the BAW resonator 100 having greater electrical power, with a substantially reduced incidence of unacceptable levels of self-heating. As can be appreciated, this improves the overall performance and reliability of the BAW resonator 100 compared to known BAW resonators. Specifically, when compared to known BAW resonators, BAW resonator 100 has an improved Q, acoustic coupling coefficient ($kt^2$); improved power handling; less degradation of insertion loss; and less, if any, shift in the passband of a filter comprising BAW resonators of the present teachings.

FIG. 1B depicts a cross-sectional view of BAW resonator 100 contemplated for use in the various apparatuses of the present teachings. As can be appreciated, the BAW resonator 100 comprises an FBAR. It is emphasized that the BAW resonator 100 is merely illustrative, and that other known BAW resonators are contemplated for use in the various apparatuses of the present teachings.

The BAW resonator 100 comprises a substrate 101, a lower electrode 102 disposed beneath a piezoelectric layer 103, which comprises a first surface in contact with a lower electrode 102 and a second surface in contact with the upper electrode 104. An optional passivation layer 105 is provided over the upper electrode 104. As will become clearer as the present description continues, the substrate 101 comprises a material that is not only amendable to known microfabrication and semiconductor processing methods, but also has a comparatively good thermal conductivity. Generally, the substrate 101 comprises silicon (i.e., polycrystalline or monocrystalline), but other materials, such as gallium arsenide (GaAs) and indium phosphide (InP), are contemplated.

A cantilevered portion 106 of the upper electrode 104 is provided on at least one side of the upper electrode 104. The cantilevered portion 106 may also be referred to as a 'wing.' It is emphasized that the use of the cantilevered portion 106 is merely illustrative, and other structures useful in improving the performance of the BAW resonator 100' (e.g., a frame element comprising a metal or a dielectric material, and disposed adjacent to the perimeter of the active area 110) are contemplated for use in addition to, or instead of the cantilevered portion 106.

The lower and upper electrodes 102, 104 each comprise one or two (bi-electrode) electrically conductive materials (e.g., molybdenum (Mo), W, Pt, Ru, Al, Ta, Cu, or Ru) and provide an oscillating electric field in the z-direction of the coordinate system shown (i.e., the direction of the thickness of the substrate 101). In the illustrative embodiment described presently, the z-axis is the axis for the TE (thickness-extensional or "longitudinal") mode(s) for the resonator. In a representative embodiment, the piezoelectric layer 103 and lower and upper electrodes 102, 104 are suspended over a cavity 107 that substantially provides acoustic isolation with the substrate 101. Accordingly, the BAW resonator 100 is a mechanical resonator, which can be electrically coupled via the piezoelectric layer 103. Other configurations that foster mechanical resonance by FBARs are contemplated. For example, as described in connection with FIG. 1C, rather than cavity 107, the BAW resonator 100 can be located over an acoustic Bragg reflector, such as a mismatched acoustic Bragg reflector (not shown in FIG. 1B) formed in or on the substrate 101 to provide acoustic isolation.

The cantilevered portion 106 of the upper electrode 104 extends over a gap 108, which illustratively comprises air. In a representative embodiment, a sacrificial layer (not shown) is deposited by a known technique over the lower electrode 102 and a portion of the piezoelectric layer 103.

The BAW resonator 100 comprises a bridge 114 along the interconnection side 112. The bridge 114 provides a gap 115, which may be a void (e.g., air) or may be filled with a low acoustic impedance material (e.g., non-etchable borosilicate glass (NEBSG), carbon doped silicon dioxide (CDO), or silicon carbide (SiC)). The bridge 114 is described in above-referenced U.S. Pat. No. 8,248,185, and as such many of the details of the bridge 114 are not repeated in the present application to avoid obscuring the description of the representative embodiments of the BAW resonator 100. As depicted in FIG. 1B, the cavity 107 has an edge 116, and the bridge 114 extends past the edge 116 of the cavity 107 (or similar reflective element, such as a mismatched Bragg reflector) and over the substrate 101. As such, in a representative embodiment, the bridge 114 is disposed partially over the cavity 107, extends over the edge 116 of the cavity 107, and is disposed partially over the substrate 101.

As noted above, the cantilevered portion 106 provides an improvement in the Q-factor. Similarly, the bridge 114 also provides an improvement in the Q-factor. Beneficially, the combination of the cantilevered portion 106 and the bridge 114 provides a further improvement in the Q-factor of the BAW resonator 100. To this end, inclusion of the bridge 114 with the cantilevered portion 106 in the BAW resonator 100 results in an improvement in the Q-factor at parallel resonance (Qp) and some impact on the Q-factor at series resonance (Qs). This is somewhat expected since the bridge 114 predominantly impacts Qp, as described in above-referenced U.S. Pat. No. 8,248,185 to Choy, et al.

As described above, the region of contacting overlap of the lower and upper electrodes 102, 104, the piezoelectric layer 103 and the cavity 107, or other acoustic reflector (e.g., Bragg reflector (see FIG. 1C)) is referred to as the active area of the BAW resonator 100. The acoustic motion of particles is launched and propagated in this area. This acoustic motion contributes to the self-heating of the BAW resonator 100 described above. By contrast, an inactive area of the BAW resonator 100 comprises a region of overlap between lower electrode 102, or upper electrode 104, or both, and the piezoelectric layer 103 is not disposed over the cavity 107, or other acoustic reflector (e.g., Bragg reflector).

The portion of the inactive area that contacts the substrate 101 may be referred to collectively as an anchor point of the BAW resonator 100 (in this case FBAR). The anchor point on the substrate 101 first ensures the mechanical robustness and support of the entire membrane formed by the acoustic stack over the cavity 107. Notably, when the acoustic reflector is a cavity (e.g., cavity 107), the active area is often referred to as a membrane.

Opening 117 is provided in the upper electrode 104 and the passivation layer 105. The opening 117 is not made in layers beneath the upper electrode (e.g., the piezoelectric layer 103, or the lower electrode 102. The opening 117 provided during fabrication of the upper electrode 104 and passivation layer 105 using known masking methods. As noted above, the opening 117 generally located substantially at the geometric center or central portion of the active area of the BAW resonator 100, and has an areal dimension that approximates the area of the region of a BAW resonator, which does not include the opening, where self-heating is the greatest.

The cantilevered portion 106 extends beyond an edge of the active area 110 by a width 109 as shown. The electrical contact 111 is connected to a signal line (not shown) and electronic components (not shown) selected for the particular application of the BAW resonator 100. This portion of the BAW resonator 100 comprises an interconnection side 112 of the BAW resonator 100. The interconnection side 112 of the upper electrode 104 to which the electrical contact 111 is made does not comprise a cantilevered portion. By contrast, one or more non-connecting sides of the BAW resonator 100 may comprise cantilevered portions 106 that extend beyond the edge of the active area 110.

The piezoelectric layer 103 comprises a highly textured piezoelectric layer (e.g., AlN), and thus has a well-defined C-axis. As described more fully below, in an apparatus comprising a plurality of BAW resonators 100, the polarization of each BAW resonator impacts the type of connection (e.g., series connection, anti-series connection) that is made between the BAW resonators 100. As will be appreciated by one of ordinary skill in the art, the growth of piezoelectric material along a C-axis of the material dictates the polarization of the BAW resonator, and thus the type of connection to be implemented. As such, providing a highly-textured piezoelectric layer 103, such as by methods described in the above-referenced U.S. Pat. No. 9,243,316 and U.S. Patent Application Publication No. 20120177816 to Larson III, et al., is useful in apparatuses comprising BAW resonator 100.

In addition to being highly-textured, the piezoelectric layer 103 of representative embodiments may also comprise one or more rare-earth (e.g., scandium (Sc)) doped layers of piezoelectric material (e.g., aluminum nitride (AlN)) as described in certain patent applications incorporated by reference above (e.g., U.S. Patent Application Publication 20140132117 to John L. Larson III; and U.S. Patent Application Publication No. 20150244347 to Feng, et al.).

FIG. 1C shows a cross-sectional view of a BAW resonator 100' in accordance with a representative embodiment. Many of the features of the BAW resonator 100' are common to those of BAW resonator 100 described in connection with representative embodiments in FIGS. 1A and 1B. The details of common features, characteristics and benefits thereof are not repeated in order to avoid obscuring the presently described embodiments.

The BAW resonator 100' comprises bridge 114 along the interconnection side 112. The bridge 114 provides a gap 115, which may be a void (e.g., air) or may be filled with a low acoustic impedance material. The bridge 114 is described in above-referenced U.S. Pat. No. 8,248,185, and as such many of the details of the bridge 114 are not repeated in the present application to avoid obscuring the description of the representative embodiments of the BAW resonator 100. As depicted in FIG. 1C, an acoustic Bragg reflector 107' comprises alternating high acoustic impedance layers and low acoustic impedance layers. The acoustic Bragg reflector 107' has an edge 116', and the bridge 114 extends past the edge 116' of the acoustic Bragg reflector 107' and over the substrate 101. As such, in a representative embodiment, the bridge 114 is disposed partially over the acoustic Bragg reflector 107', extends over the edge 116' of the acoustic Bragg reflector 107', and is disposed partially over the substrate 101.

As described above, the cantilevered portion 106 provides an improvement in the Q-factor. Similarly, the bridge 114 also provides an improvement in the Q-factor. Beneficially, the combination of the cantilevered portion 106 and the bridge 114 provides a further improvement in the Q-factor of the BAW resonator 100'. To this end, inclusion of the bridge 114 with the cantilevered portion 106 in the BAW resonator 100' results in an improvement in the Q-factor at parallel resonance (Qp) and some impact on the Q-factor at series resonance (Qs). This is somewhat expected since the bridge 114 predominantly impacts Qp, as described in above-referenced U.S. Pat. No. 8,248,185 to Choy, et al. As noted above, the cantilevered portion 106 may also be referred to as a 'wing.' It is emphasized that the use of the cantilevered portion 106 is merely illustrative, and other structures useful in improving the performance of the BAW resonator 100' (e.g., a frame element disposed adjacent to the perimeter of the active area are contemplated for use in addition to, or instead of the cantilevered portion 106.

In a representative embodiment, the piezoelectric layer 103 and lower and upper electrodes 102, 104 are disposed over an acoustic Bragg reflector 107', such as a mismatched acoustic Bragg reflector formed in or on the substrate 101. FBARs provided over an acoustic Bragg reflector are sometimes referred to as solid mount resonators (SMRs) and, for example, may be as described in above-referenced U.S. Pat. No. 6,107,721 to Lakin. Accordingly, the BAW resonator 100' is a mechanical resonator, which can be electrically coupled via the piezoelectric layer 103.

The region of contacting overlap of the lower and upper electrodes 102, 104, the piezoelectric layer 103 and the acoustic Bragg reflector 107' is referred to as the active area 110 of the BAW resonator 100'. By contrast, the inactive area of the BAW resonator 100' comprises a region of overlap between lower electrode 102 or upper electrode 104, and the piezoelectric layer 103 is not disposed over the acoustic Bragg reflector 107'.

Opening 117 is provided in the upper electrode 104 and the passivation layer 105. The opening 117 is not made in layers beneath the upper electrode (e.g., the piezoelectric layer 103, or the lower electrode 102. As noted above, the opening 117 providing during fabrication of the upper electrode 104 and passivation layer 105 using known masking methods. As noted above, the opening 117 generally located substantially at the geometric center of the active area of the BAW resonator 100, and has an areal dimension that approximates the area of the region of a BAW resonator, which does not include the opening, where self-heating is the greatest.

Figure 1D:
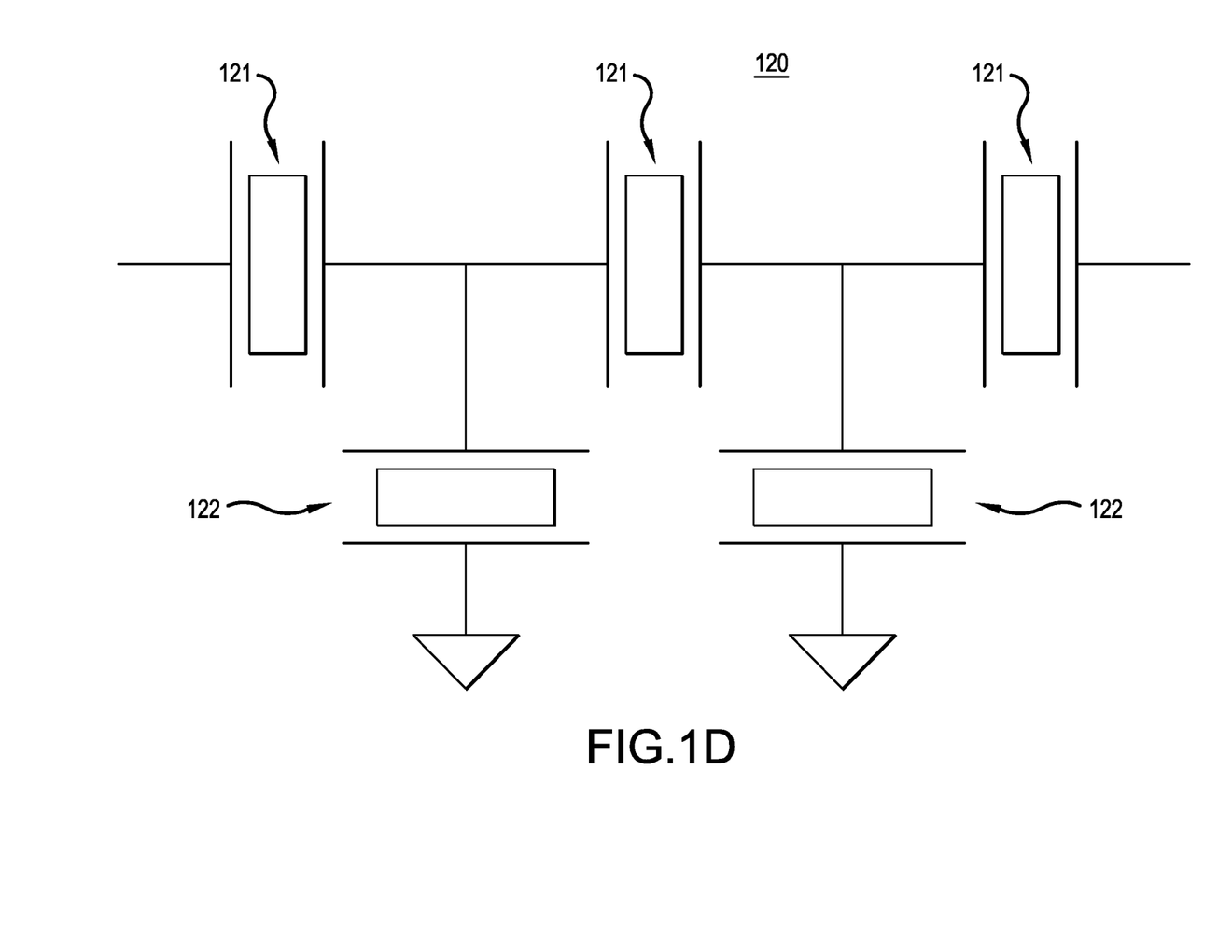
FIG. 1D is a simplified schematic block diagram of an electrical filter 120 in accordance with a representative embodiment.

As alluded to above, and as noted below, the BAW resonators and apparatuses including the BAW resonators of the present teachings are contemplated for use in electrical filter applications, for example. A basic filter design of either a ladder or a lattice topology is constituted of several sections. The number of sections is not limited but selected to trade off performances in terms of insertion loss, roll-off and rejection of the filter. FIG. 1D is a simplified schematic block diagram of an electrical filter 120 in accordance with a representative embodiment. The electrical filter 120 comprises series BAW resonators 121 and shunt BAW resonators 122. By way of illustration, the series BAW resonators 121 and shunt BAW resonators 122 may comprise the acoustic resonators described in connection with the representative embodiments of FIGS. 1A-1C. Notably, however, and as can be appreciated by one of ordinary skill in the art, self-heating is more problematic in known series resonators than in known shunt resonators. As such, in certain embodiments, only series BAW resonators 121 incorporate the teachings of the representative embodiments of FIGS. 1A-1C.

The electrical filter 120 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 120 is merely illustrative and other topologies are contemplated. Moreover, the acoustic resonators of the representative embodiments are contemplated in a variety of applications besides duplexers.

Figure 2:
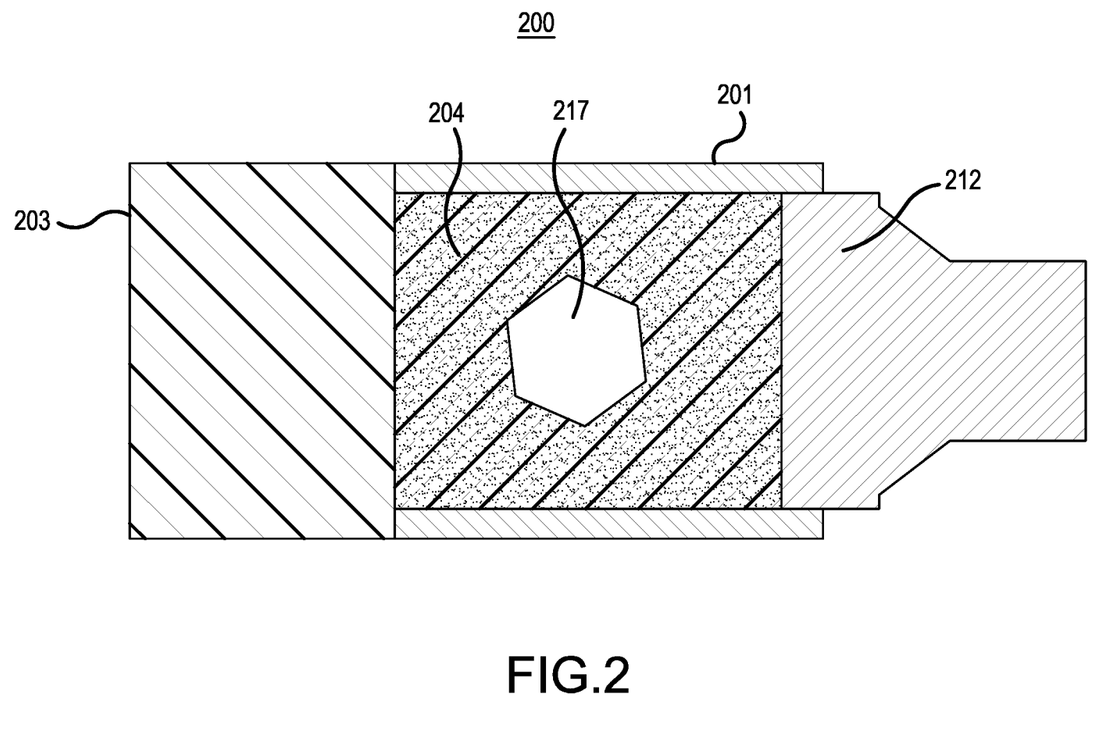
FIG. 2 is a top view of a BAW resonator in accordance with a representative embodiment.

Referring to FIG. 2, a top view of a BAW resonator 200 is depicted. Many aspects of the BAW resonators 100, 100' and terminology used in their descriptions are common to the BAW resonator 200, and are often not repeated to avoid obscuring the presently described representative embodiments.

The BAW resonator 200 comprises an interconnect side 212 for providing a signal input or signal output to the upper electrode 204. A bridge (not shown in FIG. 1A) may be provided between the upper electrode 204 and the interconnect 212; and cantilevered portions (not shown in FIG. 1A) may be provided over one or more of the sides of the upper electrode 204, excepting the side of the interconnect 212.

As depicted more clearly in FIGS. 1B and 1C, the region of contacting overlap of the lower electrode (not shown in FIG. 1A), upper electrode 204, the piezoelectric layer 203 and the cavity (not shown in FIG. 1A), or other acoustic reflector (e.g., Bragg reflector (see FIG. 1C)) is referred to as an active area of the BAW resonator 200. The acoustic motion of particles is launched and propagated in this area. This acoustic motion contributes to the self-heating of the BAW resonator 200 described below. By contrast, an inactive area of the BAW resonator 200 comprises a region of overlap between lower electrode (not shown in FIG. 1A), or upper electrode 204, or both, and the piezoelectric layer 203 is not disposed over the cavity, or other acoustic reflector (e.g., Bragg reflector).

An opening 217 is provided in the upper electrode 204. As described more fully below, the opening 217 is not made in layers beneath the upper electrode (e.g., the piezoelectric layer 203, or the lower electrode (not shown in FIG. 1A)). As will become clearer as the present description continues, the opening 217 is generally located substantially at the geometric center of the active area of the BAW resonator 200, and has an areal dimension that approximates the area of the region of a BAW resonator, which does not include the opening, where self-heating is the greatest.

As described above, the opening 217 is located in a region of the BAW resonator 200 that is susceptible to unacceptable levels of overheating caused by self-heating of the BAW resonator 200. Generally, this region is comparatively far from a thermal ground, or anchor point, which is a portion of the inactive area that contacts the substrate 201. Notably, the shape of the opening 217 is chosen to somewhat match the shape of the region where self-heating can be unacceptably high in known BAW resonators (i.e., BAW resonators without the opening). Illustratively, the opening 217 has a substantially hexagonal shape, as shown. However, this is not essential, and other shapes are contemplated as noted above.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

We claim:

1. A bulk acoustic wave (BAW) resonator, comprising:
an acoustic reflector disposed in a substrate;
a lower electrode disposed over the acoustic reflector;
a piezoelectric layer disposed over the lower electrode; and
an upper electrode disposed over the piezoelectric layer, a contacting overlap of the lower electrode, the piezoelectric layer, and the upper electrode over the acoustic reflector comprising an active area of the BAW resonator, wherein an opening exists in and extends completely through the upper electrode in a region of the BAW resonator susceptible to unacceptable overheating, the region being located where self-heating is the greatest, and having an areal dimension, wherein the opening is located in the region, and has the areal dimension.

2. The BAW resonator as claimed in claim 1, wherein the opening does not extend into the piezoelectric layer.

3. The BAW resonator as claimed in claim 1, wherein the opening exists substantially in a central portion of the upper electrode.

4. The BAW resonator as claimed in claim 1, wherein the acoustic reflector is a cavity provided in the substrate.

5. The BAW resonator as claimed in claim 1, wherein the acoustic reflector comprises alternating low acoustic impedance and high acoustic impedance layers.

6. The BAW resonator as claimed in claim 1, wherein the opening has a substantially circular shape.

7. The BAW resonator as claimed in claim 1, wherein the opening has a substantially hexagonal shape.

8. The BAW resonator as claimed in claim 1, wherein the active area is increased by an areal dimension substantially equal to an areal dimension of the opening, and the BAW resonator has substantially the same electrical impedance as a known BAW resonator having substantially the same size active area as the BAW resonator.

9. The BAW resonator as claimed in claim 1, further comprising a passivation layer disposed over the upper electrode, wherein the opening extends through the passivation layer.

10. A BAW resonator as claimed in claim 1, wherein the piezoelectric layer comprises aluminum nitride (AlN) doped with scandium (Sc).

11. The BAW resonator as claimed in claim 1, wherein a center of the opening is located at a greatest distance from an anchor point of the BAW resonator.

12. An electrical filter, comprising:
a series bulk acoustic wave (BAW) resonator connected to a shunt BAW resonator, the series BAW resonator comprising:
an acoustic reflector disposed in a substrate;
a lower electrode disposed over the acoustic reflector;
a piezoelectric layer disposed over the lower electrode; and
an upper electrode disposed over the piezoelectric layer, a contacting overlap of the lower electrode, the piezoelectric layer, and the upper electrode over the acoustic reflector comprising an active area of the series BAW resonator, wherein an opening exists in and extends completely through the upper electrode in a region of the series BAW resonator susceptible to unacceptable overheating, the region being located where self-heating is the greatest, and having an areal dimension, wherein the opening is substantially located in the region, and has the areal dimension.

13. The electrical filter as claimed in claim 12, wherein the opening does not extend into the piezoelectric layer.

14. The electrical filter as claimed in claim 12, wherein the opening exists substantially in a central portion of the upper electrode.

15. The electrical filter as claimed in claim 12, wherein the acoustic reflector is a cavity provided in the substrate.

16. The electrical filter as claimed in claim 12, wherein the acoustic reflector comprises alternating low acoustic impedance and high acoustic impedance layers.

17. The electrical filter as claimed in claim 12, wherein the opening has a substantially circular shape.

18. The electrical filter as claimed in claim 12, wherein the opening has a substantially hexagonal shape.

19. The electrical filter as claimed in claim 12, wherein the active area is increased by an areal dimension substantially equal to an areal dimension of the opening, and the series BAW resonator has substantially the same electrical impedance as a known BAW resonator having substantially the same size active area as the BAW resonator.

20. The electrical filter as claimed in claim 12, wherein the shunt BAW resonator comprising:
an acoustic reflector disposed in a substrate;
a lower electrode disposed over the acoustic reflector;
a piezoelectric layer disposed over the lower electrode; and
an upper electrode disposed over the piezoelectric layer, a contacting overlap of the lower electrode, the piezoelectric layer, and the upper electrode over the acoustic reflector comprising an active area of the shunt BAW resonator, wherein an opening exists in and extends completely through the upper electrode in a region of the shunt BAW resonator susceptible to unacceptable overheating, the region being located where self-heating is the greatest, and having an areal dimension, wherein the opening is located in the region, and has the areal dimension.

21. The electrical filter as claimed in claim 20, wherein the opening of the shunt BAW resonator does not extend into the piezoelectric layer.

22. The electrical filter as claimed in claim 20, wherein the opening of the shunt BAW resonator exists substantially in a central portion of the upper electrode.

23. The electrical filter as claimed in claim 20, wherein the acoustic reflector of the shunt BAW resonator is a cavity provided in the substrate.

24. The electrical filter as claimed in claim 20, wherein the acoustic reflector of the shunt BAW resonator comprises alternating low acoustic impedance and high acoustic impedance layers.

* * * * *